United States Patent [19]

Takahashi et al.

[11] Patent Number: 4,635,226

[45] Date of Patent: Jan. 6, 1987

[54] BLOCH LINE PAIR DRIVING DEVICE CAPABLE OF QUICKLY DRIVING EACH BLOCH LINE PAIR AT A LOW VOLTAGE

[75] Inventors: Kousuke Takahashi; Hachiro Yamada, both of Tokyo, Japan

[73] Assignee: NEC Corporation, Tokyo, Japan

[21] Appl. No.: 607,471

[22] Filed: May 7, 1984

[30] Foreign Application Priority Data

May 9, 1983 [JP] Japan ................................. 58-80374
Jun. 17, 1983 [JP] Japan ............................... 58-108684

[51] Int. Cl.$^4$ ............................................. G11C 19/08
[52] U.S. Cl. .......................................... 365/6; 365/171
[58] Field of Search ................................... 365/6, 171

[56] References Cited

U.S. PATENT DOCUMENTS 3,890,605 6/1975 Sionezewski .
4,331,887 5/1982 Jadus et al. ............................. 365/6

Primary Examiner—James W. Moffitt
Attorney, Agent, or Firm—Sughrue, Mion, Zinn, Macpeak, and Seas

[57] ABSTRACT

In a Bloch line pair driving device comprising an inductor circuit which has first and second ends and which generates a magnetic field in a predetermined direction to drive each Bloch line pair transversely of the predetermined direction, a first switch is connected to the second end and is put in an on state to gradually increase an electric current flowing from a first voltage source through the inductor circuit in a preselected sense. Gradual growth of the magnetic field results from the gradual increase of the electric current and keeps each Bloch line pair stable at each position. A current path circuit is connected to the second end along with a second voltage source providing a second voltage different from the first voltage, and is put in an active state during an off state of the first switch. The active state of the current path circuit brings about a quick decrease of the magnetic field to propagate each Bloch line pair from each position. A second switch may be connected between the first end and the first voltage source to expedite the quick decrease of the magnetic field. An additional electric current may be caused to flow through the inductor circuit in a sense opposite to the preselected sense through third and fourth switches which are connected to the first and the second ends, respectively. An additional current path circuit is connected between the first end and the second voltage source to be put in an active state during an off state of each of the third and the fourth switches.

15 Claims, 11 Drawing Figures

FIG. 9
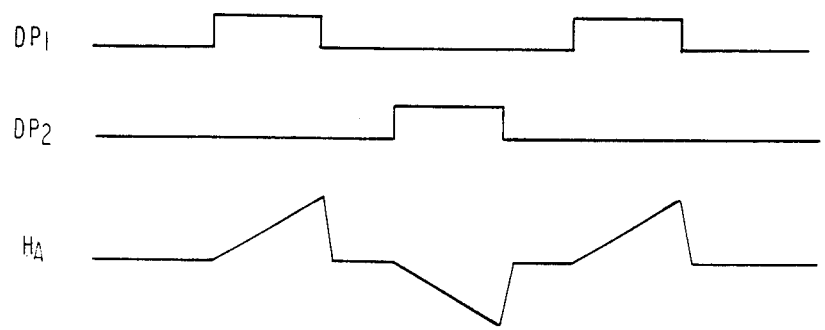
FIG. 10
FIG. 11
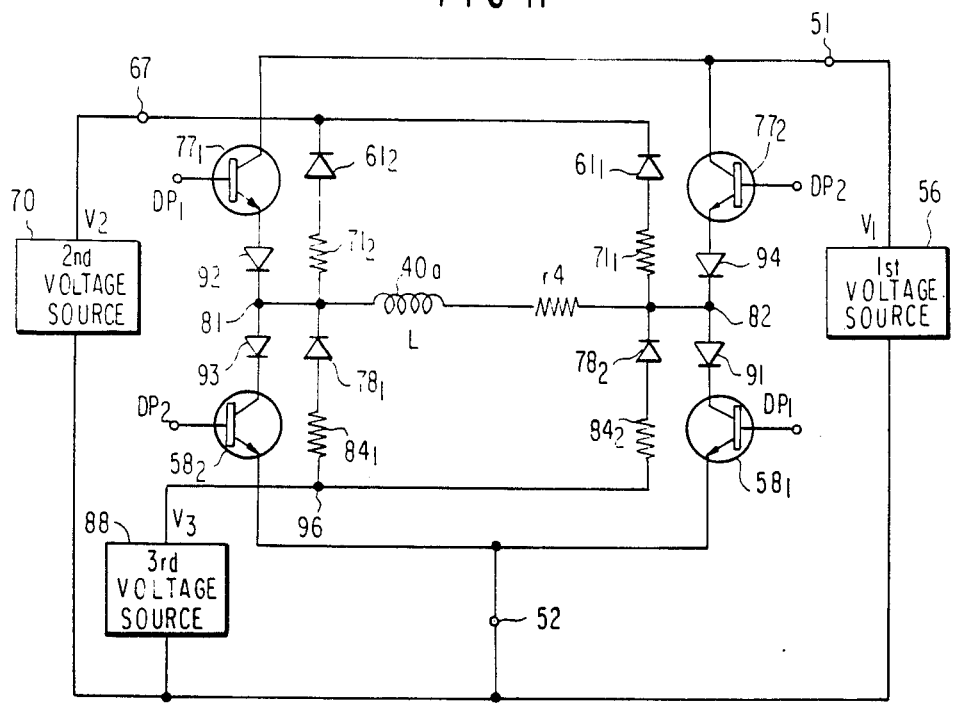

BLOCH LINE PAIR DRIVING DEVICE CAPABLE OF QUICKLY DRIVING EACH BLOCH LINE PAIR AT A LOW VOLTAGE

BACKGROUND OF THE INVENTION

This invention relates to a driving device for use in combination with a Bloch line memory device and, in particular, to a driving device for propagating each of Bloch line pairs in the Bloch line magnetic memory device.

A Bloch line memory device is proposed in the copending U.S. patent application Ser. No. 542,963 filed on Oct. 18, 1983 by Susumu Konishi et al and now U.S. Pat. No. 4,583,200. The memory device has a bit capacity which is as high as 1.6 gigabits/cm$^2$. Consideration is therefore made about application of the memory device to a file memory of a computer and to a memory decoder on board a spacecraft.

In a Bloch line memory device, each of Bloch line pairs should successively or stepwise be propagated in the memory device from a write-in position to a read-out position. For this purpose, an inductor element or coil is disposed in the vicinity of the memory device to generate a magnetic field parallel to the Bloch line pairs.

More specifically, the magnetic field must drastically be varied within a short time interval of, for example, 20 nanoseconds over a wide range. The range may be, for example, 20 Oe. Otherwise, each Bloch line pair does not begin to propagate in the memory device.

In order to propagate each Bloch line pair from an original position to an adjacent position, the inductor element is supplied from a driving circuit with a succession of driving pulses, each of which has a rise time of 20 nanoseconds from a leading edge thereof. In this event, an electric voltage must be 500 volts. Therefore, the driving device is impractical.

Let each Bloch line pair be propagated by the use of the above-mentioned driving device from the original position to the adjacent one during the rise time and each of the driving pulses have a fall time equal to the rise time. Under the circumstances, each Bloch line pair returns back to the original position from the adjacent one because the magnetic field is also rapidly varied during the fall time of each driving pulse.

Such return of the Bloch line pairs can be avoided by elongating the fall time of each driving pulse so as to slowly reduce the magnetic field. For example, the fall time is about 50 times as long as the rise time. This means that the driving pulse succession should have a low repetition frequency and each Bloch line pair is slowly propagated from the write-in position eventually to the read-out position.

SUMMARY OF THE INVENTION

It is an object of this invention to provide a driving device which is capable of rapidly propagating each Bloch line pair from a write-in position of a Bloch line memory device to a read-out position thereof.

It is another object of this invention to provide a driving device of the type described, wherein each Bloch line pair can be propagated by the use of a low voltage.

It is a further object of this invention to provide a driving device of the type described, which is simple in structure.

A Bloch line pair driving device according to this invention is for use in combination with a Bloch line memory device in which a multiplicity of Bloch line pairs are produced substantially parallel to a predetermined direction by information signals, respectively. The driving device is for applying a growing and disappearing magnetic field to the memory device in the predetermined direction to drive each Bloch line pair in the memory device transversely of the predetermined direction. The device comprises a first, a second, and a third terminal, first means for supplying a first voltage between the first and the third terminals, and second means for supplying a second voltage between the second and third terminals. The second voltage is different from the first voltage. The device comprises an inductor circuit having an axis. The inductor circuit is for coupling to the memory device with the axis directed parallel to the predetermined direction. The inductor circuit further has a first end supplied from the first means with the first voltage through the first terminal and a second end. The inductor circuit is for allowing an electric current to flow therethrough to produce the magnetic field. The device further comprises a first current path circuit between the second end and the second terminal. The first current path circuit has an active and a passive state of providing and not providing a first current path for the electric current produced in the inductor circuit, respectively. A first switch is placed between the second end and the third terminal. The switch is controllably put in an on and an off state of putting the first current path circuit in the passive state to make the first voltage produce the growing electric current in the inductor circuit and of putting the current path circuit in the active state to expedite disappearance of the electric current from the inductor circuit so that the magnetic field disappears to drive the Bloch line pair, respectively.

BRIEF DESCRIPTION OF THE DRAWING

FIG. 9 shows a time chart for use in describing operation of the driving device illustrated in FIG. 8;

FIG. 10 shows a time chart for use in describing another operation of the driving device illustrated in FIG. 8; and FIG. 11 shows a circuit diagram of a Bloch line pair driving device according to a fourth embodiment of this invention.

DESCRIPTION OF THE PREFERRED EMBODIMENTS

Figure 1:
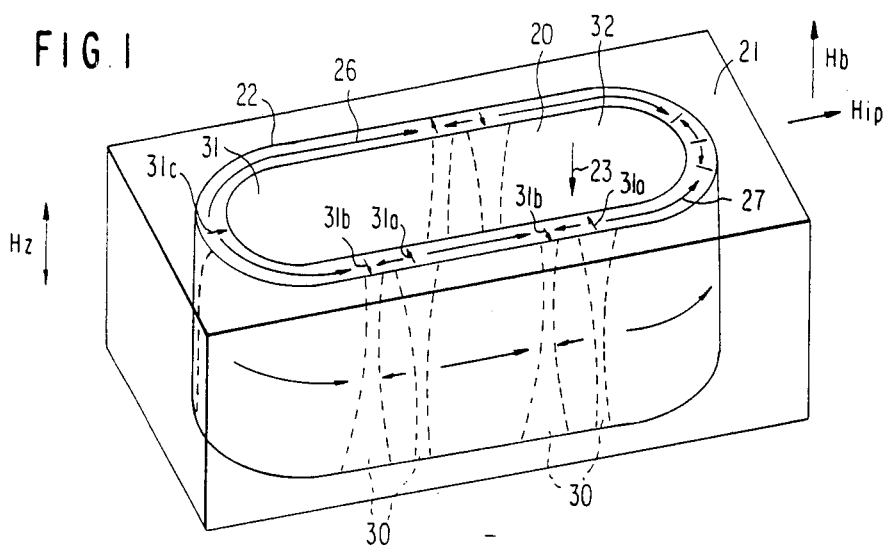
FIG. 1 diagrammatically shows a perspective view for use in describing a Bloch line memory which stores each Bloch line pair.

Referring to FIG. 1, description will be directed at first, in order to facilitate an understanding of this invention, to a stripe-shaped magnetic domain 20 of a magnetic memory device which may have a plurality of magnetic domains and serves as a Bloch line memory device or chip. A driving device according to this invention is for use in combination with such a Bloch line memory device. The stripe-shaped magnetic domain 20 which will simply be called a stripe domain is formed in a magnetic medium 21, such as a garnet layer, having a principal surface directed towards top of this figure and an easy axis of magnetization orthogonal to the principal surface. The direction of the easy axis of magnetization will be referred to as a predetermined direction. This means that the magnetic medium 21 exhibits uniaxial anisotropy. The stripe domain 20 has a domain wall 22 laid in the magnetic medium 21 to partition the magnetic medium 21 into an inner area or volume of the stripe domain 20 and an outer area thereof.

The domain wall 22 has a certain thickness and is depicted merely for convenience of illustration by solid lines. Furthermore, the inner volume is depicted merely for clarity with a shading which illustrates that the inner volume is void. In fact, the magnetic domain 20 is a solid. If a bias magnetic field Hb is directed upwards of FIG. 1, magnetization is directed in the inner area downwards as shown by an arrow 23 while magnetization is directed upwards in the outer area.

The domain wall 22 has wall magnetization therealong. The illustrated wall magnetization includes clockwise magnetization 26 and counterclockwise magnetization 27. Vertical Bloch lines 30 appear at each position at which clockwise magnetization 26 butts against the conterclockwise magnetization 27. Each vertical Bloch line 30 extends substantially parallel to the predetermined direction. As known in the art, the vertical Bloch lines 30 always exist in pairs in the domain wall 22. One of each vertical Bloch line pair 30 has magnetization directed inwards of the stripe domain 20 as depicted at 31a while the other has magnetization directed outwards of the stripe domain 20, as depicted at 31b. The one vertical Bloch line 31a is specified by a distribution of magnetization flared in an anti-trapezoidal shape, as drawn by dashed lines on both sides of the one vertical Bloch line 31a, while the other vertical Bloch line 31b is specified by a distribution of magnetization flared in a trapezoidal shape, as drawn by additional dashed lines on both sides of the other vertical Bloch line 31b, when the domain wall 22 is seen from the side thereof. As shown in FIG. 1, the wall magnetization is twisted between each vertical Bloch line pair 30 into a reversed direction.

The stripe domain 20 has a pair of end portions 31 and 32 which may be called first and second stripe heads, respectively, and an intermediate portion between the stripe heads 31 and 32.

Each vertical Bloch line pair 30 is stably kept in the domain wall 22 in the presence of the bias magnetic field Hb. When an inplane magnetic field $H_{ip}$ is given in the predetermined direction as shown in FIG. 1, the magnetization of the leftmost one 31c of the vertical Bloch lines is oriented as illustrated in FIG. 1 and the wall magnetization is stably kept along the inplane magnetic field $H_{ip}$ as exemplified in FIG. 1.

At any rate, it is possible to make each information bit correspond to presence or absence of the vertical Bloch line pair 30.

Let each of the vertical Bloch line pairs 30 be written in the domain wall 22 at the first stripe head 31 in a manner described in detail in the copending application referenced in the preamble of the instant specification and be read out of the domain wall 22 at the second stripe head 32 in the manner described also in the copending application. To this end, each vertical Bloch line pair 30 should successively or stepwise be propagated from the first stripe head 31 to the second one 32 clockwise or counterclockwise along the domain wall 22.

Such propagation of each vertical Bloch line pair 30 is possible by supply of a pulsed magnetic field Hz in the predetermined direction, namely, orthogonal to the principal surface. More specifically, the pulsed magnetic field Hz is varied in a certain time interval over a wide range as pointed out in the preamble of the instant specification. The time interval should be equal to or shorter than about 20 nanoseconds while the range must be equal to or higher than about 20 Oe. When the pulsed magnetic field Hz rapidly grows up and rapidly disappears, each vertical Bloch line pair is merely moved forwards and backwards and is not propagated from the first stripe head 31 towards the second stripe head 32. Therefore, use has conventionally been made of the pulsed magnetic field Hz which rapidly grows and slowly disappears, as mentioned before.

In addition, a pattern of Permalloy or the like is laid perpendicular to the stripe domain 20 thereunder to smoothly or stepwise propagate each vertical Bloch line pair 30 bit by bit. The Permalloy is a trade name of ATT and is an alloy which consists of a principal component of nickel, an auxiliary component of iron, and other additional component.

Figure 2:
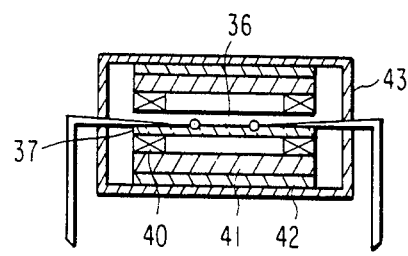
FIG. 2 shows a cross sectional view of a memory module comprising a Bloch line memory as illustrated in FIG. 1.

Referring to FIG. 2, a memory module comprises a magnetic memory device or chip 36 mounted on a substrate 37 to which a plurality of conductive leads are attached. The magnetic memory device 36 comprises a magnetic medium (FIG. 1) having a principal surface directed upwards of FIG. 2. A plurality of stripe domains are formed in the magnetic medium as shown in FIG. 1 for keeping or storing a multiplicity of vertical Bloch line pairs. The principal surface has an area of, for example, 1 cm$^2$.

The magnetic memory device 36 which is mounted on the substrate 37 is placed between a pair of coils 40 for generating the pulsed magnetic field Hz (FIG. 1) in the predetermined direction defined by the easy axis of magnetization of the magnetic medium. The pulsed magnetic field Hz is for driving or propagating each vertical Bloch line pair in the manner described in conjunction with FIG. 1. For this purpose, each coil 40 has an axis directed parallel to the predetermined direction. Anyway, each vertical Bloch line pair is driven transversely of the predetermined direction.

Each of the coils 40 is supported by a magnetic shunt plate 41 attached to a permanent magnet 42. Each magnetic shunt plate 41 is slightly inclined relative to the magnetic memory chip 36 so as to apply the inplane magnetic field $H_{ip}$ to the magnetic memory chip 36. The above-mentioned entirety is housed in a shield case 43.

The pulsed magnetic field Hz should be uniform on the magnetic memory device 36. For this purpose, each of the coils 40 should be wound at a high density and therefore has a high inductance. Moreover, a large electric current must be caused to flow through each coil 40 so as to generate a high magnetic field, such as 20 Oe.

Figure 3:
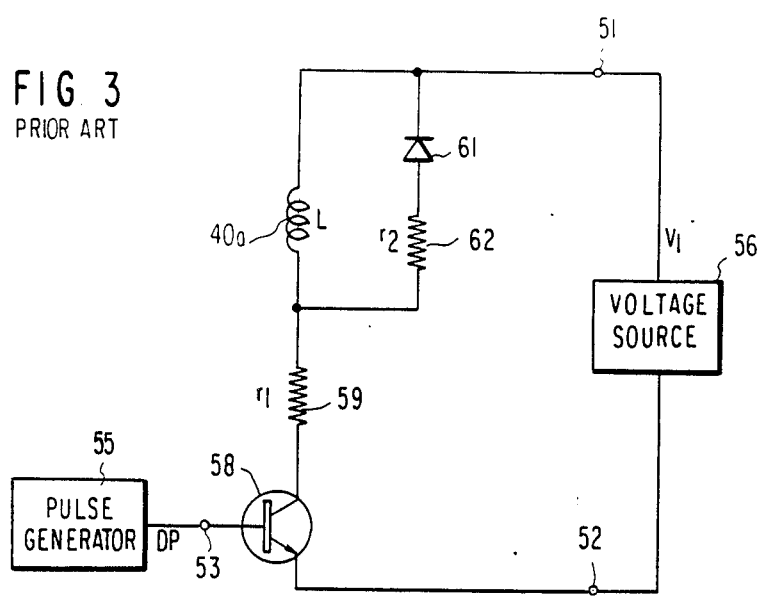
FIG. 3 shows a circuit diagram of a conventional Bloch line pair driving device for use in combination with the memory module illustrated in FIG. 2.

Referring to FIG. 3, a conventional driving device is for driving each vertical Bloch line pair 30 (FIG. 1) in the magnetic memory device 36 (FIG. 2) transversely of the predetermined direction. In FIG. 3, the coil pair 40 illustrated in FIG. 2 serves as a part of the driving device and is depicted as an inductor circuit or element 40a. The driving device comprises a source terminal 51, a reference terminal 52, and a switch terminal 53. A voltage source 56 is connected between the source and the reference terminals 51 and 52 to provide a first voltage $V_1$ therebetween. Let the first voltage $V_1$ be positive and the reference terminal 52 be grounded. The switch terminal 53 is supplied from a pulse generator 55 with a sequence of driving pulses DP having a repetition frequency f.

Responsive to the driving pulses DP, a switch 58 exemplified by an NPN transistor is connected to the reference terminal 52 and put in an on state and an off state in the presence and the absence of each driving pulse DP, respectively. In FIG. 3, it is assumed that a sum of inner resistances of the inductor element 40a and the switch 58 is equal to $r_1$ and is equivalently represented as a resistor 59. The inductor element 40a has a first end connected to the source terminal 51 and a second end connected through the resistor 59 to the switch 58.

A diode circuit is connected to the inductor element 40a in parallel and specified by a diode 61 and that forward resistance $r_2$ of the diode 61 which is represented by another resistor 62. The diode 61 has a cathode connected to the source terminal 51 and an anode connected to the second end.

In FIG. 3, let the switch 58 be put in the on state in response to each driving pulse DP with the first voltage $V_1$ supplied between the source and the reference terminals 51 and 52. In this event, an electric current i(t) flows through the inductor element 40a and is given as known in the art by:

$$i(t)=(V_1/r_1)(1-\exp[-(r_1/L)t]). \quad (1)$$

From Equation (1), it is readily understood that the electric current i(t) exponentially increases with time and asymptotically approaches $(V_1/r_1)$.

If a rise time Tr of the electric current i(t) is much less than a time constant given by $(L/r_1)$, Equation (1) is rewritten into:

$$i(t)\approx(V_1/L)t, \quad (2)$$

where $0\leq t\leq Tr$. A driving voltage $V_1'$ necessary for rising up to the first voltage $V_1$ within the rise time Tr is calculated from Formula (2) by:

$$V_1'=LI_0/Tr, \quad (3)$$

where $I_0=i(Tr)$. In order to shorten the rise time Tr, it is seen from Equation (3) that the driving voltage, namely, the first voltage $V_1$ becomes high. For example, the first voltage $V_1$ should be about 500 volts for the rise time Tr of 20 nanoseconds.

After the electric current i(t) rises up to $I_0$, the switch 58 is put in the off state, electromagnetic energy stored in the inductor element 40a is fed back to the voltage source 56 through the diode 61. The electric current i(t) is given, when begins to decrease at t=0, by:

$$i(t)=I_0\exp[-(r_2/L)t]. \quad (4)$$

The decreasing electric current i(t) given by Equation (4) lasts a fall time Tf.

Figure 4:
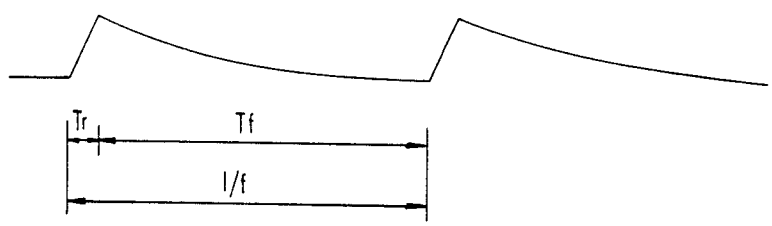
FIG. 4 shows a time chart for use in describing operation of the driving device illustrated in FIG. 3.

Referring to FIG. 4 together with FIG. 3, the electric current i(t) which flows through the inductor element 40a exhibits a waveform shown in FIG. 4. As exemplified in FIG. 4, the fall time Tf is longer than the rise time Tr.

The rise time Tr can be reduced to 20 nanoseconds by increasing the first voltage $V_1$. On the other hand, the fall time Tf is determined by another time constant $(L/r_2)$ and can not be shortened because the inductance L is large as pointed out hereinabove.

Let the pulsed magnetic field more than 20 Oe be generated with the electric current i(t) having an amplitude of the order of 1 A. The inductance L must exceed 10 microhenries. In order to render the rise time Tr equal to or less than 20 nanoseconds, the first voltage $V_1$ should be 500 volts or so. On the other hand, the fall time Tf becomes as long as 5 or 6 microseconds. Accordingly, the repetition frequency f of the driving pulses DP can not exceed 200 KHz.

Thus, the conventional driving device is disadvantageous as pointed out in the preamble of the instant specification.

Figure 5:
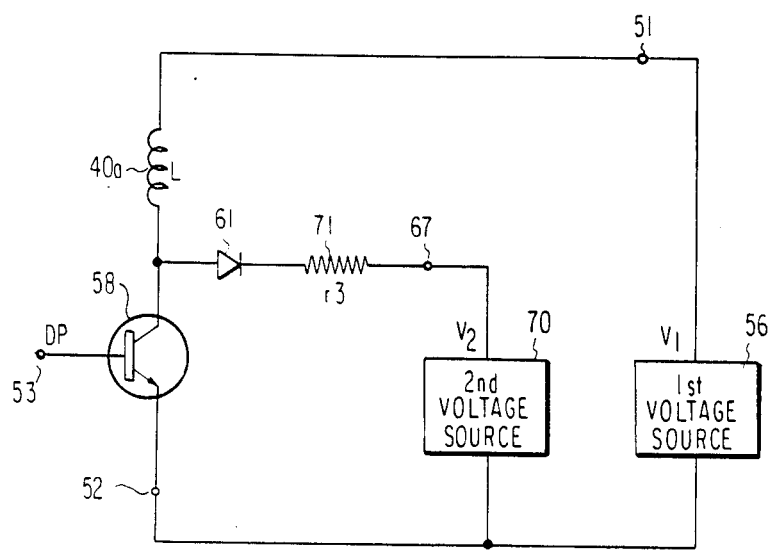
FIG. 5 shows a circuit diagram of a Bloch line pair driving device according to a first embodiment of this invention.

Referring to FIG. 5, a driving device according to a first embodiment of this invention comprises similar parts designated by like reference numerals and symbols. The illustrated driving device further comprises an additional terminal 67 and an additional voltage source 64 in addition to the source and the reference terminals 51 and 52 and the voltage source 56. In this connection, the source, the additional, and the reference terminals 51, 67, and 52 will be referred to as first, second, and third terminals, respectively, while the voltage source 56 and the additional voltage source 70 will be called first and second voltage sources, respectively. The second voltage source 70 provides a second voltage $V_2$ between the second and the third terminals 67 and 52. Let the second voltage $V_2$ be assumed to be positive and higher than the first voltage $V_1$. The first voltage $V_1$ in FIG. 5 is considerably lower than the first voltage $V_1$ in FIG. 3, although the same reference symbol is used in FIGS. 3 and 5. For example, the first voltage $V_1$ in FIG. 5 is 10 volts while the second voltage $V_2$ is 30 volts.

In addition, a diode circuit is connected between the second end of the inductor element 40a and the second terminal 67. The illustrated diode circuit comprises a diode 61, like in FIG. 3, and an additional resistor 71 of resistance $r_3$ connected to the diode 61 in series. The diode 61 has an anode connected to the second end of the inductor element 40a and a cathode connected to the second terminal 67 through the additional resistor 71. The resistances $r_1$ and $r_2$ illustrated in FIG. 3 are negligibly smaller than the resistance $r_3$ and therefore omitted from FIG. 5. For example, the resistance $r_3$ is equal to 2 kiloohms. In this connection, the resistances $r_1$ and $r_2$ may be included in the resistance $r_3$.

It should be noted here that the switch terminal 53 may be supplied with the driving pulses DP having a repetition frequency of 1 MHz.

With this structure, the switch 58 is put in an on and an off state in the presence and the absence of each driving pulse DP, respectively. An electric current i(t)

is caused to flow through the inductor element 40a during the on state of the switch 58 in a manner similar to that described in conjunction with FIGS. 3 and 4. In this event, the diode circuit is put into an inactive or passive state because the electric current is suppressed by the diode 61. Therefore, the electric current i(t) varies in accordance with Equation (1). However, such variation slowly proceeds in comparison with FIG. 3 because the first voltage $V_1$ in FIG. 5 is considerably lower than that described with reference to FIG. 3. As a result, the electric current i(t) gradually increases to a maximum current $i_0(Tr)$ after lapse of the rise time Tr. This means that each vertical Bloch line pair is not propagated during the rise time Tr because the pulsed magnetic field slowly rises in the example illustrated in FIG. 5. For convenience of description, the maximum current i(Tr) is represented by $I_0$.

On the other hand, when the switch 58 is put in the off state in the absence of each driving pulse, a voltage rapidly increases at the second end of the inductor element 40a in a positive direction in relation to counter electromotive force developed at the second end. Therefore, the diode 61 becomes conductive to reduce the electric current i(t). Thus, the diode circuit is put into an active state to provide a current path for the electric current produced in the inductor element 40a. The rise time Tr is followed by the fall time Tf. If the fall time begins at t=0, the electric current i(t) is given by:

$$i(t) = I_0 - (I_0 + ((V_2 - V_1)/r_3))(1 - \exp[-(r_0/L)t]). \quad (5)$$

Thus, the electric current i(t) decreases during the fall time Tf in accordance with Equation (5).

The fall time Tf lasts until the decreasing electric current i(t) becomes equal to zero. The fall time Tf is therefore given by substituting zero for i(t) in Equation (5). The resultant fall time Tf is given by:

$$Tf = -(L/r_3)\ln\{1 - (I_0/I_0) - ((V_2 - V_1)/r_3)\} \quad (6)$$
$$= (L/r_3)\ln(1 + (r_3 I_0)/(V_2 - V_1)),$$

where ln is representative of a natural logarithm.

From Equation (6), it will readily be understood that the fall time Tf is variable in dependence upon the resistance $r_3$ and a voltage difference between the second and the first voltages $V_2$ and $V_1$. Specifically, the fall time Tf can become short by increasing the resistance $r_3$ and the voltage difference $(V_2-V_1)$. Let the resistance $r_3$ and the voltage difference $(V_2-V_1)$ be equal to 2 kiloohms and 20 volts, respectively, with the inductance L kept at 10 microhenries. Under the circumstances, the fall time Tf becomes equal to 23 nanoseconds.

Thus, the diode circuit is put into the active state and the passive state of providing and not providing the current path in cooperation with the switch 58. Therefore, the diode circuit may be called a current path circuit. In the active state, disappearance of the electric current is expedited by the use of the second voltage source 70.

Figure 6:
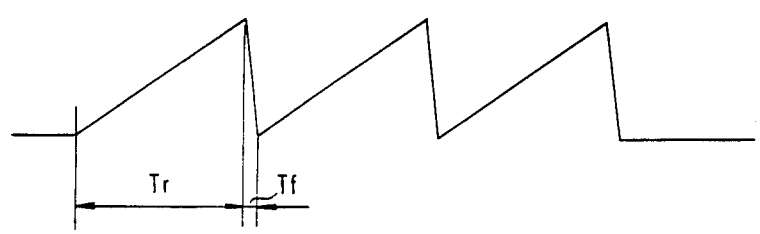
FIG. 6 shows a time chart for use in describing operation of the driving device illustrated in FIG. 5.

Referring to FIG. 6, a waveform of the electric current i(t) is specified by the fall time Tf considerably shorter than the rise time Tr. With the driving device illustrated in FIG. 5, each vertical Bloch line pair (FIG. 1) is propagated during the fall time Tf because the electric current i(t) quickly varies during the fall time Tf.

It is preferable that the rise time Tr is as short as possible. However, each vertical Bloch line pair (FIG. 1) should not be shifted during the rise time Tr. From this standpoint, the rise time Tr must not be shorter than 20 nanoseconds. Let the repetition frequency f, the inductance L, and the maximum current $I_0$ be equal to 1 MHz, 10 microhenries, and 1 A, respectively. In this event, the first voltage $V_1$ becomes equal to 10 volts. When the fall time Tf of 23 nanoseconds is determined, the second voltage $V_2$ may be 30 volts, as readily understood from the above.

If each of the first and the second voltages $V_1$ and $V_2$ is negative, the second voltage $V_2$ should be lower than the first voltage $V_1$. In addition, the anode and the cathode of the diode 61 must be directed to the second terminal 67 and the second end of the inductor element 40a, respectively. As a result, the electric current i(t) gradually increases in a negative direction during the rise time Tr and rapidly decreases during the fall time Tf. Therefor, the electric current i(t) has an asymmetrical waveform as illustrated in FIG. 6. As seen in that Figure, the pulsed magnetic field slowly grows and, to provide an asymmetrical waveform disappears during the rise time Tr and the fall time Tf, respectively.

Electric power is almost consumed by the additional resistor 71 because the resistance $r_3$ of the additional resistor 71 is very large as compared with the resistance of the inductor element 40a. Accordingly, it is preferable that a radiator is attached to the additional resistor 71.

Figure 7:
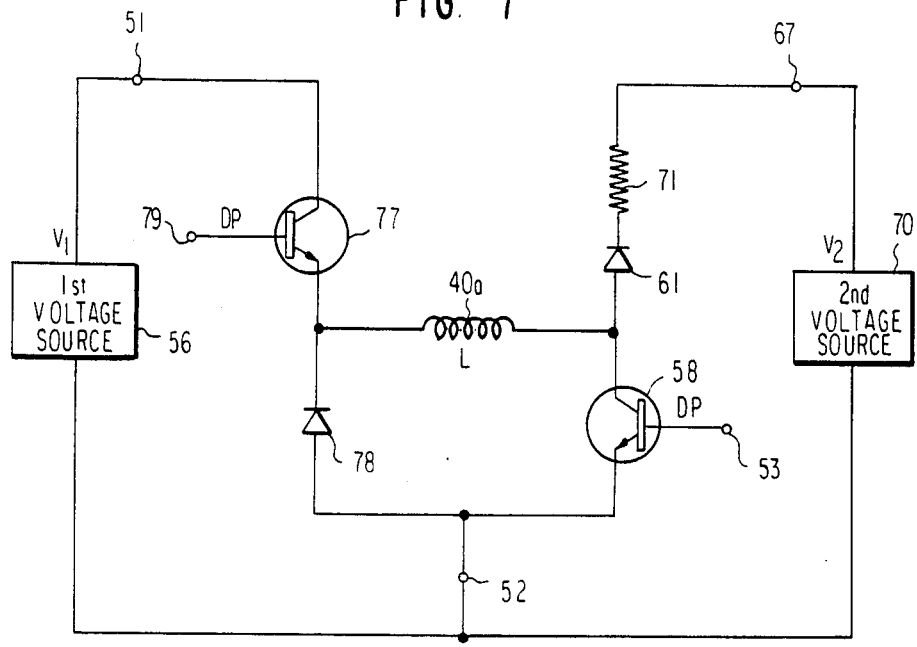
FIG. 7 shows a circuit diagram of a Bloch line pair driving device according to a second embodiment of this invention.

Referring to FIG. 7, a Bloch line driving device according to a second embodiment of this invention is similar to that illustrated in FIG. 5 except that an additional switch 77 of NPN transistor is connected between the first terminal 51 and the first end of the inductor element 40a and that a clamp diode 78 is placed between the first end of the inductor element 40a and the third terminal 52. In the example being illustrated, the anode of the clamp diode 78 is connected direct to the third terminal 52. The switch 58 and the additional switches 77 will be referred to as first and second switches, respectively. The second switch 77 is supplied with the driving pulses DP through an additional switch terminal 79 and put in an on state and an off state simultaneously with the first switch 58 by the driving pulses DP.

Let the first and the second voltages $V_1$ and $V_2$ be positive and each of the first and the second switches 58 and 77 be simultaneously put into the on state. As a result, the electric current i(t) flows from the first terminal 51 to the third terminal 52 through the second switch 77, the inductor element 40a, and the first switch 58 and grows in accordance with Equation (1) during the rise time Tr, with the diode circuit (61 and 71) kept in the inactive or the passive state.

Let each of the first and the second switches 58 and 77 be put into the off state. As a result, the fall time Tf starts with the inductor element 40a disconnected from the first terminal 51 by the second transistor 77. During the fall time Tf, the electric current i(t) flows from the third terminal 52 to the second terminal 67 through the clamp diode 78, the inductor element 40a, the diode 61, and the additional resistor 71. In this event, the electric current i(t) is calculated by substituting zero for $V_1$ in Equation (5). Likewise, the fall time Tf is calculated by substituting zero for $V_1$ in Equation (6) and is given by:

$$Tf = (L/r_3) \ln(((r_3 I_0)/V_2) + 1). \quad (7)$$

It is readily understood from Equation (7) that the second voltage $V_2$ can be reduced in comparison with the driving device illustrated in FIG. 5 in order to accomplish the same fall time Tf. For example, the second voltage $V_2$ may be equal to 20 volts so as to render the fall time Tf into 23 nanoseconds with the inductance L and the additional resistors $r_3$ kept at 10 microhenries and 2 kiloohms, respectively.

When each of the first and the second voltages $V_1$ and $V_2$ is negative, the diode 61 and the clamp diode 78 should be reversed relative to the illustrated direction. It is needless to say that the second voltage $V_2$ is lower than the first voltage $V_1$.

Like in FIG. 5, the illustrated driving device can generate, by the use of low source voltages, the pulsed magnetic field having the rise time Tr not longer than 1 microsecond and the fall time Tf of the order of 20 nanoseconds, even when the inductor element 40a has a large inductance.

Figure 8:
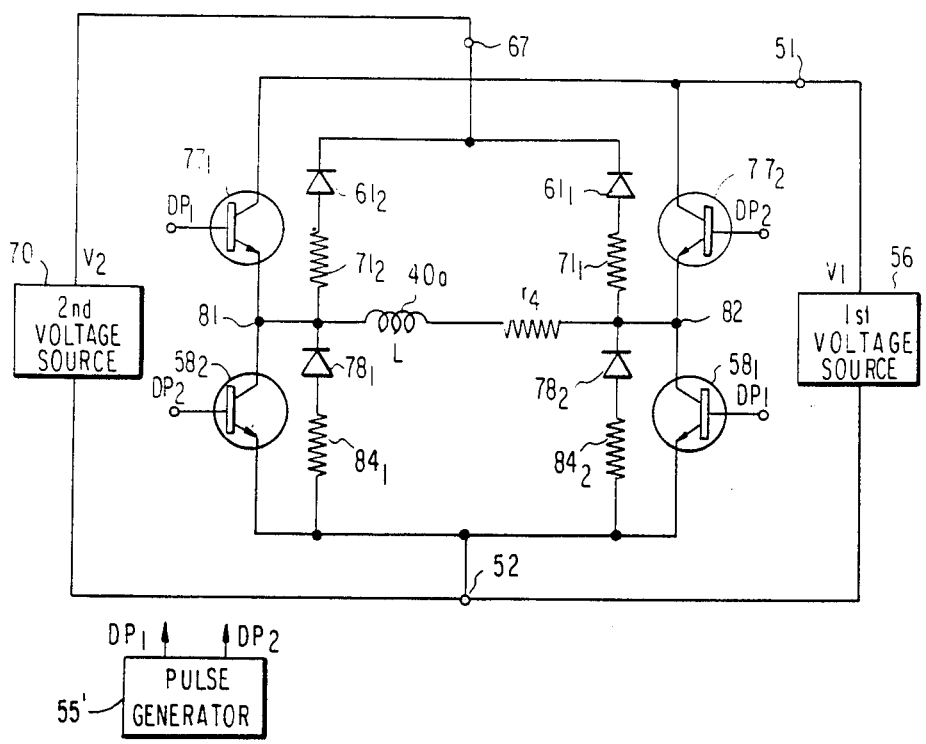
FIG. 8 shows a circuit diagram of a Bloch line pair driving device according to a third embodiment of this invention.

Referring to FIG. 8, a driving device according to a third embodiment of this invention is for selectively generating positive and negative pulsed magnetic fields by causing an electric current to forwardly and backwardly flow through an inductor element 40a. The illustrated inductor element 40a is specified by a series connection of an inductance L and an internal resistance $r_4$ of the inductor element 40a in FIG. 8. The inductor element 40a has the first and the second ends 81 and 82 illustrated on the lefthand and the righthand sides of the inductor element 40a, respectively. Like in FIG. 7, the first and the second voltge sources 56 and 70 are connected between the first and the third terminals 51 and 52 and between the second and the third terminals 67 an 52, respectively.

The driving device comprises first and second portions for generating the positive and the negative pulsed magnetic fields. Each of the first and the second portions is substantially equivalent to the driving device illustrated in FIG. 7. In order to specify the first and the second portions, subscripts "1" and "2" are attached to reference numerals indicative of parts related to the first and the second portions, respectively.

More specifically, the first portion comprises a first switch $58_1$ between the second end 82 and the third terminal 52 and a second switch $77_1$ between the first terminal 51 and the first end 81. A diode circuit of a diode $61_1$ and an additional resistor $71_1$ which serves as a first current path circuit as described in conjunction with FIG. 5 is connected between the second terminal 67 and the second end 82 and may be called a first diode circuit. An additional series circuit of a clamp diode $78_1$ and a subsidiary resistor $84_1$ is connected to the first end 81 and will be referred to as a second diode circuit.

Likewise, the second portion comprises a pair of switches $58_2$ and $77_2$ which will be called third and fourth switches, respectively. A third diode circuit of a diode $61_2$ and an additional resistor $71_2$ is connected between the second terminal 67 and the first end 81. The third diode circuit may be referred to as a second current path circuit because the third diode circuit is operable in a manner similar to the first current path circuit, namely, the first diode circuit. In addition, another additional diode circuit of a clamp diode $78_2$ and a subsidiary resistor $84_2$ is connected to the second end 82 and may be called a fourth diode circuit.

The second and the fourth diode circuits are connected in common at a point of connection therebetween. The point of connection may be called a fourth terminal. In the illustrated device, the fourth terminal is directly connected to the third terminal 52 grounded. The first and the third switches $58_1$ and $58_2$ are also connected to the fourth terminal together with the second and the fourth diode circuits.

A pair of the first and the second switches $58_1$ and $77_1$ is simultaneously driven by each of first driving pulses $DP_1$ with the third and the fourth switches $58_2$ and $77_2$ kept inactive. Similarly, a pair of the third and the fourth switches $58_2$ and $77_2$ is driven by each of second driving pulses $DP_2$ with the first and the second switches $58_1$ and $77_1$ kept inactive. The first and the second driving pulses $DP_1$ and $DP_2$ are produced by a pulse generator 55' in a manner to be presently described. Thus, the first and the second switches $58_1$ and $77_1$ are operated independently of the third and the fourth switches $58_2$ and $77_2$.

Referring to FIG. 9 together with FIG. 8, it is assumed that each of the first and the second voltages $V_1$ and $V_2$ is positive and that each of the first driving pulses $DP_1$ is supplied to the first and the second switches $58_1$ and $77_1$ with the second driving pulses $DP_2$ stopped. In the case, the second voltage $V_2$ is higher than the first voltage $V_1$, as described in conjunction with FIG. 7.

Under the circumstances, the electric current i(t) flows from the first terminal 51 towards the third terminal 52 through the second switch $77_1$, the inductor element 40a, and the first switch $58_1$. The electric current i(t) grows in the presence of each of the first driving pulses $DP_1$ in accordance with Equation (1) or (2) to cause the positive magnetic field depicted at $H_p$ in FIG. 9 to occur in the inductor element 40a. As shown in FIG. 9, the positive pulsed magnetic field $H_p$ grows during the rise time Tr defined by presence of each of the first driving pulses $DP_1$.

When each of the first and the second switches $58_1$ and $77_1$ is put into the off state by absence of each driving pulse $DP_1$, the rise time Tr is finished and followed by the fall time Tf. During the fall time Tf, the electric current i(t) flows from the third terminal 52 to the second terminal 67 through the second diode circuit of the clamp diode $78_1$ and the resistor $84_1$, the inductor element 40a, and the first diode circuit of the resistor $71_1$ and the diode $61_1$. The electric current i(t) decreases during the fall time Tf in the manner described with reference to FIG. 7. Inasmuch as the fall time Tf is given by Equation (7), it is possible to shorten the fall time Tf by selecting the second voltage $V_2$ and the resistance $r_3$ which is equal to a sum of the resistances of the resistors $84_1$ and $71_1$ and the internal resistor $r_4$ in FIG. 8.

When the second driving pulses $DP_2$ are delivered from the pulse generator 55' to the third and the fourth switches $58_2$ and $77_2$, each of the third and the fourth switches $58_2$ and $77_2$ are put in the on state to cause an additional electric current to flow through the inductor element 40a in a backward direction from the second end of the inductor element 40a towards the first end thereof. As a result, the negative pulsed magnetic field depicted at $H_N$ in FIG. 9 is produced by the inductor element 40a in a manner similar to that described in conjunction with the first driving pulses $DP_1$. The negative pulsed magnetic field $H_N$ negatively varies or grows during the rise time Tr and rapidly decreases during the fall time Tf.

With this structure, the repetition frequency of each driving pulse can be increased to 1 MHz or so, as is the case with the driving device illustrated in FIG. 7.

Referring to FIG. 10 afresh and FIG. 8 again, the first and the second driving pulses $DP_1$ and $DP_2$ are alternatingly produced by the pulse generator 55'. The first driving pulses $DP_1$ are delivered to the first and the second switches $58_1$ and $77_1$ while the second driving pulses $DP_2$ are delivered to the third and the fourth switches $58_2$ and $77_2$. Accordingly, operation of the first and the second switches $58_1$ and $77_1$ alternates with that of the third and the fourth switches $58_2$ and $77_2$. As a result, positive and negative pulsed magnetic fields alternatingly appear as illustrated at $H_4$ in FIG. 10.

Referring to FIG. 11, a driving device according to a fourth embodiment of this invention is similar to that illustrated in FIG. 8 except that a third voltage source 88 provides a third voltage $V_3$ and that first through fourth protection diodes 91 to 94 are connected to the first through the fourth switches $58_1$, $77_1$, $58_2$, and $77_2$, respectively. The third voltage source 88 is connected between the third terminal 52 and the fourth terminal depicted at 96. As shown in FIG. 11, the second and the fourth diode circuits ($78_1$ and $84_1$; $78_2$ and $84_2$) are connected in common with the first and the third switches $58_1$ and $58_2$ disconnected from the fourth terminal 96. If the first and the second voltage sources 56 and 70 produces positive voltages as the first and the second voltages $V_1$ and $V_2$, respectively, with the third terminal 52 grounded, the third voltage $V_3$ is kept at a voltage moderately lower than the ground potential and is therefore negative.

With this structure, each potential at the first and the second ends 81 and 82 is variable within a range from the second voltage $V_2$ to the third voltage $V_3$. Such a range exceeds an amplitude determined by the first voltage $V_1$ and the ground potential during the rise time Tr. This means that a voltage supplied across the inductor element 40a during the fall time Tf becomes larger than the first voltage $V_1$. Therefore, the illustrated driving device enables a reduction of the fall time Tf as compared with that illustrated in FIG. 8.

The first through the fourth protection diodes 91 to 94 are for avoiding breakage of the first through the fourth switches $58_1$, $58_2$, $77_1$, and $77_2$ which results from wide variation of each potential at the first and the second ends 81 and 82. If each switch is formed by a transistor having a high withstanding voltage, the first through the fourth protection diodes 91 to 94 may be unnecessary.

If each of the first and the second voltages $V_1$ and $V_2$ is negative and the first voltage $V_1$ is higher than the second voltage $V_2$, the third voltage $V_3$ should be positive. In addition, each of the diodes $61_1$, $61_2$, $78_1$, and $78_2$ is directed in an inverse direction together with the first through the fourth protection diodes 91 to 94. Moreover, each switch $58_1$, $58_2$, $77_1$, and $77_2$ is constituted by a PNP transistor instead of an NPN transistor.

While this invention has thus far been described in conjunction with several embodiments thereof, it will readily be possible for those skilled in the art to put this invention into practice in various other manners. For example, each of the first through the fourth switches may be formed by a PNP transistor or an MOS transistor. The third terminal 52 is not always grounded but is given a preselected reference potential different from the ground potential.

What is claimed is:

1. A Bloch line pair driving device for use in combination with a Bloch line memory device in which a multiplicity of Bloch line pairs are produced substantially parallel to a predetermined direction by information signals, respectively, in a domain wall of each magnetic domain, said driving device being adapted to apply a growing and disappearing magnetic field having an asymmetrical waveform to said each magnetic domain in said predetermined direction to drive each Bloch line pair along said domain wall transversely of said predetermined direction and comprising:

a first, a second, and a third terminal;
first means for supplying a first voltage between said first and said third terminals;
second means for supplying a second voltage between said second and said third terminals, said second voltage being different from said first voltage;
an inductor circuit having an axis and being for coupling to said memory device with said axis directed parallel to said predetermined direction, said inductor circuit further having a first end supplied from said first means with said first voltage through said first terminal and a second end, said inductor circuit being adapted to allow an electric current to flow therethrough to produce said magnetic field;
a first current path circuit between said second end and said second terminal, said first current path circuit having an active and a passive state of providing and not providing a first current path for discharging the electric current produced in said inductor circuit, respectively; and
a first switch between said second end and said third terminal, said first switch being controllably put in an on and an off state of putting said first current path circuit in said passive state to make said first voltage produce the growing electric current in said inductor circuit and of putting said current path circuit in said active state to expedite disappearance of the electric current from said inductor circuit so that said magnetic field rapidly changes to drive the Bloch line pair, respectively.

2. A Bloch line pair driving device as claimed in claim 1, wherein said first current path circuit comprises:
a series connection between said second end and said second terminal, said series connection having a first diode and a resistor connected to said first diode in series, said first diode becoming conductive to put said first current path circuit in said active state and, thereby, to provide said first current path only when said first switch is put in said off state.

3. A Bloch line pair driving device as claimed in claim 2, wherein each of said first and said second voltages is positive relative to a reference voltage given to said third terminal, said second voltage being greater than said first voltage.

4. A Bloch line pair driving device as claimed in claim 2, wherein each of said first and said second voltages is negative relative to a reference voltage given to said third terminal, said second voltage being lower than said first voltage.

5. A Bloch line pair driving device as claimed in claim 1, wherein said first end of the inductor circuit is connected direct to said first terminal.

6. A Bloch line pair driving device as claimed in claim 1, further comprising:
a fourth terminal;
a second switch between said first terminal and said first end, said second switch being put in an on and an off state simultaneously with said first switch; and
an additional diode circuit between said first end and said fourth terminal, said additional diode circuit having a second diode which becomes conductive only when each of said first and said second switches is put in the off state.

7. A Bloch line pair driving device as claimed in claim 6, wherein said fourth terminal is connected direct to said third terminal.

8. A Bloch line pair driving device as claimed in claim 6, further comprising:
a third switch between said first end and said third terminal, said third switch being controllably put in an on state and an off state independently of each of said first and said second switches;
a fourth switch between said second end and said first terminal, said fourth switch being put in an on state and an off state simultaneously with said third switch for allowing an additional electric current to flow through said inductor circuit in a direction from said second end towards said first end during the on state of each of said third and said fourth switches;
a second current path circuit between said first end and said second terminal, said additional current path being conductive only when each of said third and said fourth switches is put in the off state; and
a subsidiary diode circuit between said second end and said fourth terminal, said subsidiary diode circuit becoming conductive only when each of said third and said fourth diodes is put in the off state.

9. A Bloch line pair driving device as claimed in claim 8, wherein said fourth terminal is connected direct to said third terminal.

10. A Bloch line pair driving device as claimed in claim 8, further comprising:
third means between said third and said fourth terminals for supplying a third voltage different from each of said first and said second voltages, between said third and said fourth terminals.

11. A Bloch line pair driving device as claimed in claim 10, wherein each of said first and said second voltages is positive relative to a reference voltage given to said third terminal with said second voltage greater than said first voltage, said third voltage being negative.

12. A Bloch line pair driving device as claimed in claim 10, wherein each of said first and said second voltages is negative relative to a reference voltage given to said third terminal with said second voltage lower than said first voltage, said third voltage being positive.

13. A Bloch line pair driving device for use in combination with a Bloch line memory device in which a multiplicity of Bloch line pairs are produced substantially parallel to a predetermined direction by information signals, respectively, said driving device being for applying a growing and disappearing magnetic field to said memory device in said predetermined direction to drive each Bloch line pair in said memory device transversely of said predetermined direction and comprising:
a first, a second, and a third terminal;
first means for supplying a first voltage between said first and said third terminals;
second means for supplying a second voltage between said second and said third terminals, said second voltage being different from said first voltage;
an inductor circuit having an axis and being for coupling to said memory device with said axis directed parallel to said predetermined direction, said inductor circuit further having a first end and a second end and being for allowing an electric current to flow therethrough to produce said magnetic field;
a first switch between said second end and said third terminal, said first switch being controllably put in an on and an off state;
a second switch between said first end and said first terminal, said second switch being put in an on and an off state simultaneously with said first switch to allow the electric current to flow from said first means through said inductor circuit in cooperation with said first switch and, thereby, to make said inductor circuit generate said magnetic field; and
a first diode circuit between said second end and said second terminal, said first diode circuit having a first diode which becomes conductive only when each of said first and said second switches is simultaneously put in the off state; and
a second diode circuit between said first end and said third terminal, said second diode circuit having a second diode which becomes conductive only when each of said first and said second switches is simultaneously in the off state, said second diode circuit expediting disappearance of the electric current from said inductor circuit in cooperation with said first diode circuit so that said magnetic field disappears to drive the Bloch line pair.

14. A Bloch line pair driving device for use in combination with a Bloch line memory device in which a multiplicity of Bloch line pairs are produced substantially parallel to a predetermined direction by information signals, respectively, said driving device being for applying a growing and disappearing magnetic field to said memory device in said predetermined direction to drive each Bloch line pair in said memory device transversely of said predetermined direction and comprising:
a first, a second, and a third terminal;
first means for supplying a first voltage between said first and said third terminals;
second means for supplying a second voltage between said second and said third terminals, said second voltage being different from said first voltage;
an inductor circuit having an axis and being for coupling to said memory device with said axis directed parallel to said predetermined direction, said inductor circuit further having a first end and a second end and being for allowing an electric current to flow therethrough to produce said magnetic field;
a first switch between said second end and said third terminal, said first switch being controllably put in an on and an off state;
a second switch between said first end and said first terminal, said second switch being put in an on and an off state simultaneously with said first switch to allow the electric current to flow from said first means through said inductor circuit in cooperation with said first switch and, thereby, to make said inductor circuit generate said magnetic field; and a first diode circuit between said second end and said second terminal, said first diode circuit having a first diode which becomes conductive only when each of said first and said second switches is simultaneously put in the off state;

a second diode circuit between said first end and said third terminal, said second diode circuit having a second diode which becomes conductive only when each of said first and said second switches is simultaneously in the off state, said second diode circuit expediting disappearance of the electric current from said inductor circuit in cooperation with said first diode circuit so that said magnetic field disappears to drive the Bloch line pair;

a third switch between said first end and said third terminal, said third switch being controllably put in an on and an off state independently of said first and said second switches;

a fourth switch between said second end and said first terminal, said fourth switch being put in an on and an off state simultaneously with said third switch to allow an additional electric current to flow from said first means through said inductor circuit in cooperation with said third switch and to make said inductor circuit generate an additional magnetic field, said additional electric current flowing through said inductor circuit in a direction opposite to that of said electric current while said additional magnetic field is reversed in polarity relative to said magnetic field;

a third diode circuit between said first end and said second terminal, said third diode circuit having a third diode which becomes conductive only when each of said third and said fourth switches is simultaneously put in the off state; and a fourth diode circuit between said second end and said third terminal, said fourth diode circuit having a fourth diode which becomes conductive only when each of said third and said fourth switches is simultaneously put in the off state, said fourth diode circuit expediting disappearance of the additional electric current from said inductor circuit in cooperation with said third diode circuit so that said additional magnetic field disappears to drive the Bloch line pair.

15. A Bloch line pair driving device for use in combination with a Bloch line memory device in which a multiplicity of Bloch line pairs are produced substantially parallel to a predetermined direction by information signals, respectively, said driving device being for applying a growing and disappearing magnetic field to said memory device in said predetermined direction to drive each Bloch line pair in said memory device transversely of said predetermined direction and comprising:

a first, a second, a third, and a fourth terminal;

first means for supplying a first voltage between said first and said third terminals;

second means for supplying a second voltage between said second and said third terminals, said second voltage being different from said first voltage;

third means for supplying a third voltage between said fourth and said third terminals, said third voltage being different from said first and said second voltages;

an inductor circuit having an axis and being for coupling to said memory device with said axis directed parallel to said predetermined direction, said inductor circuit further having a first end and a second end and being for allowing an electric current to flow therethrough to produce said magnetic field;

a first switch between said second end and said third terminal, said first switch being controllably put in an on and an off state;

a second switch between said first end and said first terminal, said second switch being put in an on and an off state simultaneously with said first switch to allow the electric current to flow from said first means through said inductor circuit in cooperation with said first switch and, thereby, to make said inductor circuit generate said magnetic field; and a first diode circuit between said second end and said second terminal, said first diode circuit having a first diode which becomes conductive only when each of said first and said second switches is simultaneously put in the off state;

a second diode circuit between said first end and said fourth terminal, said second diode circuit having a second diode which becomes conductive only when each of said first and said second switches is simultaneously in the off state, said second diode circuit expediting disappearance of the electric current from said inductor circuit in cooperation with said first diode circuit and said second and said third means so that said magnetic field disappears to drive the Bloch line pair;

a third switch between said first end and said third terminal, said third switch being controllably put in an on and an off state independently of said first and said second switches;

a fourth switch between said second end and said first terminal, said fourth switch being put in an on and an off state simultaneously with said third switch to allow an additional electric current to flow from said first means through said inductor circuit in cooperation with said third switch and to make said inductor circuit generate an additional magnetic field, said additional electric current flowing through said inductor circuit in a direction opposite to that of said electric current while said additional magnetic field is reversed in polarity relative to said magnetic field;

a third diode circuit between said first end and said second terminal, said third diode circuit having a third diode which becomes conductive only when each of said third and said fourth switches is simultaneously put in the off state; and a fourth diode circuit between said second end and said fourth terminal, said fourth diode circuit having a fourth diode which becomes conductive only when each of said third and said fourth switches is simultaneously put in the off state, said fourth diode circuit expediting disappearance of the additional electric current from said inductor circuit in cooperation with said third diode circuit and said second and said third means so that said additional magnetic field disappears to drive the Bloch line pair.

* * * * *